United States Patent [19]

Urushima

[11] Patent Number: 4,931,993
[45] Date of Patent: Jun. 5, 1990

[54] MEMORY PROTECTION ARRANGEMENT
[75] Inventor: Teturou Urushima, Yokohama, Japan
[73] Assignee: Matsushita Electric Industrial Co., Ltd., Osaka, Japan
[21] Appl. No.: 100,366
[22] Filed: Sep. 23, 1987
[30] Foreign Application Priority Data Sep. 26, 1986 [JP] Japan .................. 61-226287

[51] Int. Cl.$^5$ .............. G11C 7/00; G11C 8/00
[52] U.S. Cl. .............. 365/189.01; 365/189.07; 365/230.08; 365/228; 365/195; 371/67.1
[58] Field of Search .......... 365/228, 230, 189, 195, 365/189.01, 189.07; 364/200, 300 MS, 900; 371/67

[56] References Cited

U.S. PATENT DOCUMENTS

| | | | |
|---|---|---|---|
| 4,402,044 | 8/1983 | McDonough et al. | 364/200 |
| 4,521,852 | 6/1985 | Guttag | 364/200 |
| 4,521,853 | 6/1985 | Guttag | 364/200 |
| 4,724,521 | 2/1988 | Carron et al. | 364/200 X |
| 4,744,062 | 5/1988 | Nakamura et al. | 365/228 |
| 4,796,235 | 1/1989 | Sparks et al. | 365/189 X |

Primary Examiner—Stuart N. Hecker
Assistant Examiner—Alyssa H. Bowler
Attorney, Agent, or Firm—Stevens, Davis, Miller & Mosher

[57] ABSTRACT

A memory protection arrangement comprises a controller, a memory, first and second memory address self-hold circuits, first and second address comparators and a memory write signal controlling gate. The controlling gate is responsive to the output signal of the second comparator to control memory write such that a current address falling within a range between memory addresses of the first and second memory address self-hold circuits inhibits the memory from being written. The controller then performs an abnormality processing to stop the operation. The operation is stopped as soon as a write signal develops in a program area in the event that the program is caused by a terminal device to tend to undergo runaway and the program is protected from destruction. Through initialization by turn-on of a power supply, the program can be started to process with the operation.

8 Claims, 3 Drawing Sheets

MEMORY PROTECTION ARRANGEMENT

BACKGROUND OF THE INVENTION

This invention relates to a memory protection arrangement for use in a portable terminal device adapted for inventory control in a warehouse.

Conventionally, memory protection has been realized in various ways. One method is such that sum check data or the like is registered in a specified area of a memory when the memory is accidentally destroyed and the data is detected at ON/OFF timing for a power supply. With this method, therefore, abnormality can not be decided quickly in the event that a program becomes abnormal. In terms of hardware, this method is materialized as shown in FIG. 1 by including a controller 21 and a memory 22. The memory 22 is coupled to the controller 21 via a data bus 23 and an address bus 24 and controlled for reading by a memory read signal RD on line 25 and for writing by a memory write signal WT on line 26.

In another method, the 8-bit configuration generally used for memories is changed to a 9-bit configuration including one bit which is constantly used as a parity bit for checking. Disadvantageously, realization of all memories of a portable device with the 9-bit configuration is very costly and unpractical.

Generally, in many portable terminal devices, programs are stored in a ROM and inputted data is registered in a RAM. But, today, a RAM having a program which is down-loaded from a center apparatus has been used increasingly in many applications in order to smoothly comply with frequent change in specifications. This trend invites a problem that as soon as data in a RAM is destroyed by, for example, a noise, a program stored in the RAM immediately undergoes destruction and runaway.

SUMMARY OF THE INVENTION

An object of this invention is to provide a memory protection arrangement, for use in a portable terminal device having a RAM down-loaded with a program, which can prevent destruction and runaway of the program even in the event of occurrence of a noise.

Another object of this invention is directed to prevention of destruction of master data such as a conversion table which is down-loaded, together with a program, to a RAM of a portable terminal device.

DESCRIPTION OF THE PREFERRED EMBODIMENTS

Figure 1:
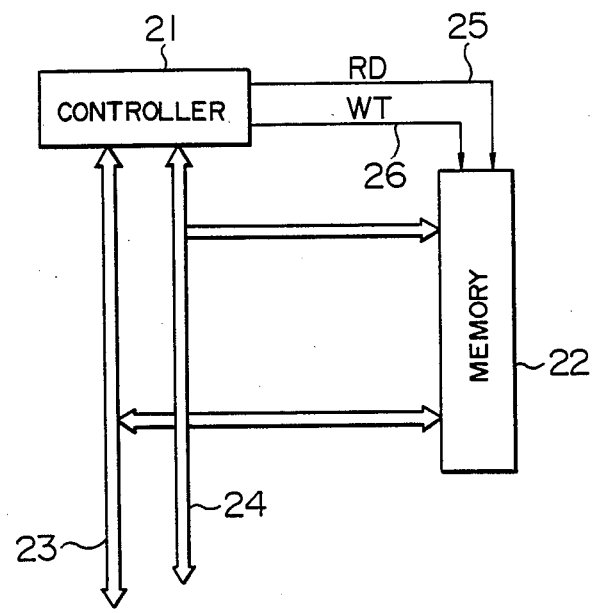
FIG. 1 is a block diagram illustrating a prior art controller/memory arrangement.
Figure 2:
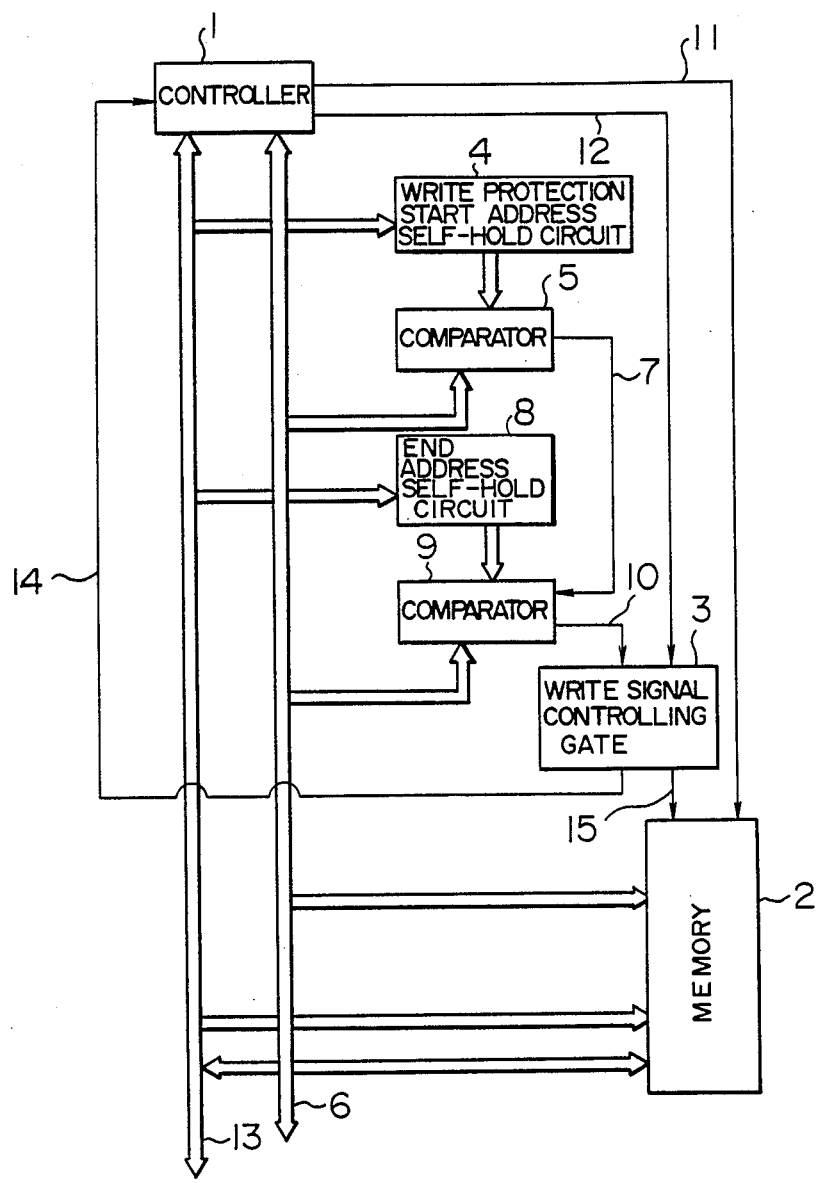
FIG. 2 is a block diagram illustrating memory protection arrangement according to an embodiment of the invention.

Referring to FIG. 2, a preferred embodiment of a memory protection arrangement of the invention is schematically shown therein and it comprises a controller 1, a memory 2, a write signal controlling gate 3, a write protection start address self-hold circuit 4, comparators 5 and 9, and an end address self-hold circuit 8.

The comparator 5 compares an address of the self-hold circuit 4 with a current address on an address bus 6 and produces a comparison signal 7 when the later address is larger than the former address. The comparator 9 produces a comparison signal 10 when the current address is smaller than an address of the self-hold circuit 8 and at the same time the comparison signal 7 appears. A signal on line 11 is for reading the memory 2 and a signal on line 12 is for writing the memory 2. When the arrangement is activated for protection, the controller 1 receives a command for operation stop via a signal line 14 and when the arrangement is deactivated for protection, the write signal is applied to the memory 2 via a line 15. Denoted by 13 is a data bus.

In operation, the controller 1 is down-loaded with a program from a center apparatus and when values of the start address self-hold circuit 4 and end address self-hold circuit 8 are initially set such that start address (4) > end address (8), no comparison signal 10 is delivered out of the comparator 9 and so the write signal on line 12 is permitted to be applied to the memory 2 via the controlling gate 3 and line 15. Consequently, the program can be written into the memory 2 via the address bus 6 and data bus 13. A start address same as that of the program area is subsequently set for the start address self-hold circuit 4 and end address same as that of the program area is set for the end address self-hold circuit 8 so as to carry out normal operations. Accidentally, when the data on address bus 6 falls within a range between the start address and end address, i.e., start address (4) < address on bus < end address (8) the write signal on line 12 is outputted, the comparator 5 is activated to produce the comparison signal 7 and concurrently, the comparator 9 is activated to produce the comparison signal 10 which in turn activates the write signal controlling gate 3 so that the write signal on line 12 is inhibited from going to the line 15, thus disabling the data from being written into the memory 2. At that time, the write signal controlling gate 3 issues to the controller 1 a signal for commanding a stop processing and an abnormality processing is then executed.

Figure 3:
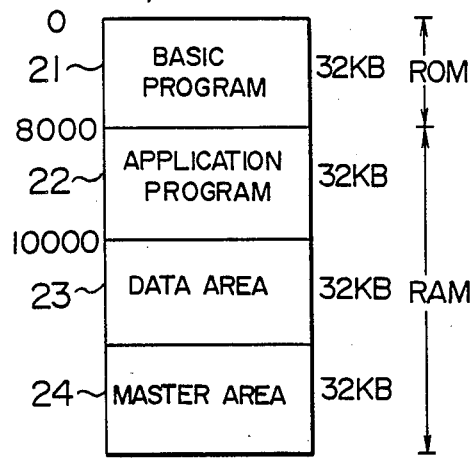
FIG. 3 illustrates data areas in a RAM of a portable terminal device.

In accordance with the teachings of the invention master data can be protected as will be described below. A RAM of a portable terminal device has data areas as illustrated in FIG. 3 and data in the RAM can be protected according to a flow chart of FIG. 4. As an example, a ROM is of 32K Byte and the RAM is of 96K Byte, providing a data area of 128K Byte in total as shown in FIG. 3. The ROM of 32K Byte has a basic program 21 of, for example, operating system, and the RAM has 32K bits of an application program 22 down-loaded from the center apparatus, 32K bits of a data area 23 which stores data indicative of start of the application program and data inputted and displayed by operating a keyboard of the portable terminal device, and 32K bits of a master area 24 which stores a conversion table used for converting inputted codes into names of goods, unit costs and so on. Numerals on the lefthand side of FIG. 3 are indicated in terms of hexadecimal number.

Figure 4:
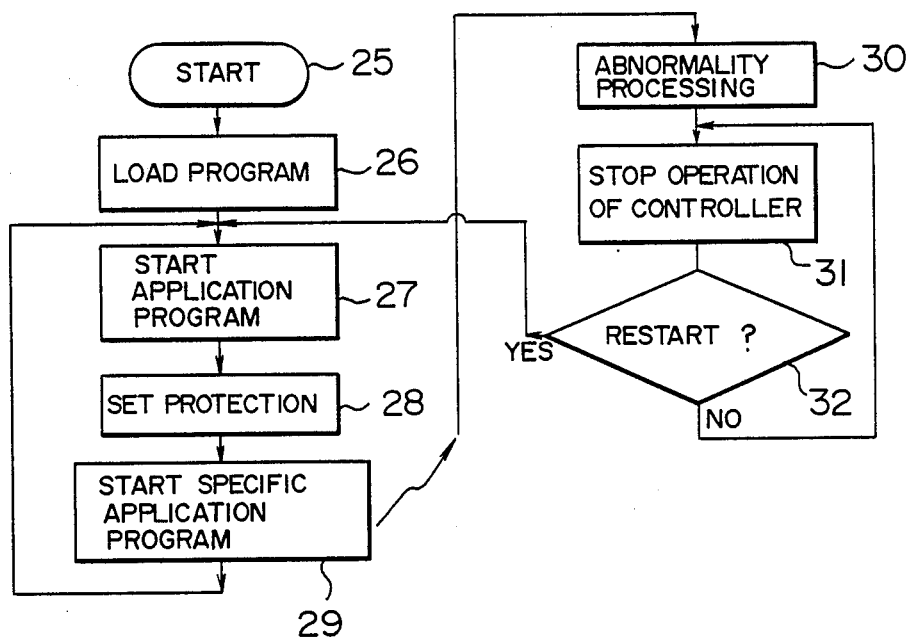
FIG. 4 is a flow chart illustrative of protection of data in the RAM.

In operation, the basic program 21 of the RM is first started (step 25 in FIG. 4) and the application program is loaded to the RAM from a host computer of the center apparatus (step 26 in FIG. 4). Thereafter, the application program 22 is started (step 27) and a protect area is set on H'8000 to H'FFFF address (hexadecimal number) for protecting the application program from destruction (step 28). In the event that write is accidentally instructed for the protection area, an abnormal signal is generated and thereafter the controller 1 stops operating. When the abnormality is detected through hardware, an abnormality processing is started (step 29) and the controller 1 enters into the abnormality processing (step 30). The controller 1 is then caused to stop operating through hardware (step 31). When normality is subsequently detected through hardware, the controller 1 is restarted (step 32) and the application program recovers (step 27).

By applying protection to the data area after starting of the application program, inputted data can be prevented from destroying. In renewing the data, the protect function is released and rewriting is carried out. Thereafter, the protection function is set. Especially, in the case of the portable terminal device, such data as unit costs, names and the like are prepared in the master area and utilized when the application program is executed. By again applying protection to the data after reception thereof from the host computer of the center apparatus, the data in the master area can be prevented from destroying.

The invention may also be applied to promote efficiency of development of software for application programs. In developing an application program of the portable terminal device, software for the application program is developed using a personal computer or the like and eventually the portable terminal device is down-loaded with an object program so as to be operated for checking the application program. During this procedure, the operation of the portable terminal device after becomes abnormal and it is required for checking that the application program be down-loaded again from the personal computer.

In such an event, protection can be applied to the other portion than the object to be developed by taking advantage of the present invention, thereby ensuring that when an abnormal phenomenon occurs, controlling can be stopped at a location where the abnormality takes place and the abnormal phenomenon can therefore be checked with ease by restarting the portable terminal device. In this manner, the checking operation can be executed quickly to improve the efficiency of development.

Advantageously, according to the invention, data in the program will not be rewritten accidentally and the program can initially be started through initialization to start the operation normally.

In a system having master data in addition to the program, protection can be applied to the master data to prevent it from destroying.

Compactness and inexpensiveness are required of the portable terminal device and the invention can be applied to protect the memory of such a portable terminal device at a low cost, attaining practical effects.

We claim:

1. A portable terminal device having a memory protected from being overwritten but which is freely readable, said device comprising:
   a memory connected to an address bus and a data bus for storing data contained on the data bus in addresses contained on the address bus and upon receipt of a write signal;
   a controller connected to said data bus and address bus and supplying data on the data bus and addresses on the address bus, said controller providing said write signal to enable the storing of data in said memory and a read signal to enable reading of said memory, said controller controlling the writing of data into and the reading of data out of addressed areas of said memory;
   a first comparator for producing a first comparison signal when an address on the address bus is greater than a start address of at least a portion of said memory to be protected from being overwritten;
   a second comparator for producing a second comparison signal when an address on said address bus is less than an end address of said portion of said memory to be protected from being overwritten and at the same time said first comparison signal is received by said second comparator; and
   a write signal controlling gate for interrupting an application of said write signal from said controller to said memory and for issuing a command to cease normal processing to said controller under control of said second comparison signal, said controller operating to freely allow data contained in said protected portion of said memory to be read out.

2. A device as in claim 1 wherein said write signal controlling gate interrupts the application of said write signal to said memory and issues said command when said second comparison signal is received.

3. A device as in claim 1 wherein said write signal controlling gate interrupts the application of said write signal to said memory and issues said command when said second comparison signal is not received.

4. A device as in claim 1 wherein said protected portion of said memory contains at least a portion of a processing program.

5. A device as in claim 1 wherein said controller specifies said start and end addresses for said first and second comparators and can change said start and end addresses.

6. A device as in claim 1 wherein said memory is a random access memory.

7. A portable terminal device comprising:
   a data bus;
   an address bus;
   a random access memory communicating with said data and address buses and storing data therein under control of a write signal, said random access memory containing an application program area, a keyboard data storage area for storing data from a keyboard, and a conversion table data area for storing a data conversion table;
   means for protecting said application program area, said keyboard data storage area and said conversion table data area of said random access memory from being overwritten with new data, said protecting means being connected to said address bus and preventing application of said write signal to said random access memory when an address on said address bus indicates a memory address within any one of said application program storage table data area; and
   means for allowing data stored in said application program area, said keyboard data storage area and said conversion table data area to be freely read out.

8. A memory protection apparatus comprising:
   a computer for entering and checking an application program and for converting the application program into an object code program;
   a portable terminal device having a random access memory for receiving said object code program and storing it in said random access memory, said random access memory communicating with a data bus and address bus provided in said portable terminal device;

write protection means provided in said portable terminal device for designating at least one protected area of said random access memory and for monitoring said address bus and preventing said protected area of said memory from being overwritten with new data when an address on said address bus designates for data writing a memory address within said at least one protected area; and means for allowing data stored in said at least one protected area to be freely readout.

* * * * *